United States Patent
Lesso et al.

(10) Patent No.: US 11,627,414 B2
(45) Date of Patent: *Apr. 11, 2023

(54) MICROPHONE SYSTEM

(71) Applicant: Cirrus Logic International Semiconductor Ltd., Edinburgh (GB)

(72) Inventors: John P. Lesso, Edinburgh (GB); Thomas I. Harvey, Northcote (AU)

(73) Assignee: Cirrus Logic, Inc., Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/710,152

(22) Filed: Mar. 31, 2022

(65) Prior Publication Data
US 2022/0225027 A1 Jul. 14, 2022

Related U.S. Application Data

(63) Continuation of application No. 17/091,359, filed on Nov. 6, 2020, now Pat. No. 11,323,810.

(60) Provisional application No. 62/949,029, filed on Dec. 17, 2019.

(51) Int. Cl.
*H04R 1/10* (2006.01)
*H04R 3/04* (2006.01)
*H03G 5/16* (2006.01)
*H04R 1/08* (2006.01)
*H04R 3/02* (2006.01)
*H04R 3/00* (2006.01)

(52) U.S. Cl.
CPC .............. *H04R 3/04* (2013.01); *H03G 5/165* (2013.01); *H04R 1/08* (2013.01); *H04R 1/1016* (2013.01); *H04R 1/1041* (2013.01); *H04R 3/02* (2013.01)

(58) Field of Classification Search
CPC .......... H04R 3/04; H04R 1/08; H04R 1/1016; H04R 1/1041; H04R 3/02; H03G 5/165
USPC ............................................................ 381/74
See application file for complete search history.

(56) References Cited

U.S. PATENT DOCUMENTS

| | | | |
|---|---|---|---|
| 4,357,492 A | 11/1982 | Campbell et al. | |
| 11,323,180 B2* | 5/2022 | Jia | H04B 10/697 |
| 11,323,810 B2* | 5/2022 | Lesso | H04R 1/1016 |
| 2010/0191528 A1 | 7/2010 | Okuda et al. | |
| 2012/0321105 A1* | 12/2012 | McGrath | G10L 19/008 |
| | | | 381/119 |
| 2013/0197920 A1* | 8/2013 | Lesso | H04L 25/4902 |
| | | | 704/500 |
| 2013/0322655 A1* | 12/2013 | Schuldt | H04R 3/005 |
| | | | 381/119 |

(Continued)

OTHER PUBLICATIONS

International Search Report and Written Opinion of the International Searching Authority, International Application No. PCT/GB2020/052793, dated Jan. 27, 2021.

(Continued)

*Primary Examiner* — Ammar T Hamid
(74) *Attorney, Agent, or Firm* — Jackson Walker L.L.P.

(57) ABSTRACT

A microphone system, comprises a first transducer, for generating a first acoustic signal, and a second transducer, for generating a second acoustic signal. A high-pass filter receives the first signal and generates a first filtered signal, and a low-pass filter receives the second signal and generates a second filtered signal. An adder forms an output signal of the microphone system as a sum of the first filtered signal and the second filtered signal.

19 Claims, 6 Drawing Sheets

(56) References Cited

U.S. PATENT DOCUMENTS

| | | | |
|---|---|---|---|
| 2014/0192990 A1* | 7/2014 | Cheng | H04R 29/00 |
| | | | 381/56 |
| 2014/0270312 A1 | 9/2014 | Melanson et al. | |
| 2015/0163592 A1* | 6/2015 | Alderson | G10K 11/17817 |
| | | | 381/71.6 |
| 2015/0318829 A1* | 11/2015 | Astgimath | H03F 3/505 |
| | | | 330/291 |
| 2015/0373476 A1* | 12/2015 | Christoph | H04S 7/302 |
| | | | 381/303 |
| 2016/0337744 A1 | 11/2016 | Seungil et al. | |
| 2017/0178628 A1 | 6/2017 | Macours et al. | |
| 2017/0366898 A1* | 12/2017 | Melanson | H04R 1/04 |
| 2018/0122400 A1* | 5/2018 | Rasmussen | H04R 3/005 |
| 2018/0129922 A1* | 5/2018 | Nielsen | G06K 19/06206 |
| 2018/0167649 A1 | 6/2018 | Hayakawa | |
| 2019/0149920 A1 | 5/2019 | Putzeys et al. | |
| 2020/0021910 A1 | 1/2020 | Rollow, IV et al. | |
| 2020/0162805 A1 | 5/2020 | Lesso | |
| 2020/0326208 A1* | 10/2020 | Zilli | G01R 33/0029 |

OTHER PUBLICATIONS

Morita, A. et al.: "Two-Way Unidirectional Consenser Microphone", NHK Laboratories Note, NHK Technical Research Laboratories, Tokyo, JP, No. 297, Mar. 1, 1984.

Robjohns, Hugh: "Audio Technica AE2500 Dynamic/Electret Kickdrum Microphone Review", Sound on Sound Magazine, Dec. 31, 2003, Retrieved from the Internet: https://www.soundonsound.com/reviews/audio-technica-ae2500.

* cited by examiner

MICROPHONE SYSTEM

The present application is a continuation of U.S. patent application Ser. No. 17/091,359, filed Nov. 6, 2020, which claims priority to U.S. Provisional Patent Application Ser. No. 62/949,029, filed Dec. 17, 2019, each of which is incorporated by reference herein in its entirety.

TECHNICAL FIELD

This relates to a microphone system, and in particular to a microphone system with at least two transducers.

BACKGROUND

Many electronic devices include transducers in the form of microphones, for generating electronic signals in response to ambient sounds.

For example, smartphones contain multiple microphones, in order to detect ambient sounds such as the user's voice. In addition, accessories such as earphones contain microphones, which may for example be used for detecting ambient sounds for use in a noise cancelling system.

However, one problem with many widely available microphones is that they have a poor signal-to-noise ratio at low frequencies, for example below 1 kHz. One issue is that, because the microphones are included in products that are intended for outdoor use, where they may be subject to the effects of low frequency wind noise, they are often provided with an acoustic high pass filter that reduces the sensitivity of the microphone at frequencies below about 100 Hz. Another issue is that the noise of the microphone package tends to increase significantly at frequencies below 1 kHz.

These two effects combine to limit the usefulness of many conventional microphones to detect small signals at frequencies below 1 kHz.

It is known, for example from US2014/0270312, that it is possible to use a loudspeaker as a microphone. However, when acting as a microphone, a loudspeaker will usually have lower sensitivity and a worse signal-to-noise ratio at higher frequencies than a typical microphone.

SUMMARY

According to an aspect of the present invention, there is provided a microphone system, comprising:
  a first transducer, for generating a first acoustic signal;
  a second transducer, for generating a second acoustic signal;
  a high-pass filter, for receiving the first signal and generating a first filtered signal, wherein the first transducer and the second transducer have different acoustic properties;
  a low-pass filter, for receiving the second signal and generating a second filtered signal; and
  an adder, for forming an output signal of the microphone system as a sum of the first filtered signal and the second filtered signal.

The different acoustic properties may mean that the first transducer and the second transducer have different noise levels as a function of frequency, and/or may mean that the first transducer and the second transducer have different frequency responses.

The first and second transducers may be of different types. For example, the possible different transducer types may include microphones, loudspeakers configured to act as microphones, accelerometers, gyroscopes, and contact microphones, and the first transducer may be one of these types while the second transducer is another of these types.

In one example, the second transducer may be a loudspeaker. In this example, the first transducer may be a microphone.

A cut-off frequency of the high-pass filter may be approximately equal to a cut-off frequency of the low-pass filter.

The cut-off frequencies of the high-pass filter and of the low-pass filter may be dynamically adjustable.

In particular, the cut-off frequencies of the high-pass filter and of the low-pass filter may be dynamically adjustable in response to a detected magnitude of the first signal. In that case, the microphone system may comprise a control block for increasing the cut-off frequency of the high-pass filter and of the low-pass filter in response to determining that the detected magnitude of the first signal is greater than a first threshold value.

Alternatively, the cut-off frequencies of the high-pass filter and of the low-pass filter may be dynamically adjustable in response to a detected magnitude of the second signal. In that case, the microphone system may comprise a control block for decreasing the cut-off frequency of the high-pass filter and of the low-pass filter in response to determining that the detected magnitude of the second signal is greater than a second threshold value.

The first transducer may be configured to operate either in a first mode, in which it generates the first signal as a digital signal, or in a second mode, in which it generates the first signal as an analog signal.

The first transducer may be configured to operate either in a first mode, in which it generates the first signal as a digital signal with a first sampling rate, or in a second mode, in which it generates the first signal as a digital signal with a second sampling rate.

The microphone system may further comprise at least one of:
  a first equaliser, configured to apply a first equaliser function to the first filtered signal before it is passed to the adder; and
  a second equaliser, configured to apply a second equaliser function to the second filtered signal before it is passed to the adder.

The microphone system may further comprise:
  a first band-pass filter, configured to receive the first signal during a calibration mode;
  a second band-pass filter, configured to receive the second signal during the calibration mode;
  an adjustable gain block; and
  a feedback loop,
  wherein the first band-pass filter and the second band-pass filter each have pass bands that encompass a first frequency at which the high-pass filter and the low-pass filter both pass signals,
  wherein the feedback loop acts during the calibration mode to determine a gain value required such that the first signal and the second signal have the same magnitude at the first frequency, and
  wherein, in operation of the microphone system, said required gain value is applied to the first filtered signal and/or to the second filtered signal before it is passed to the adder.

The required gain value may be applied to the first filtered signal in the first equaliser and/or to the second filtered signal in the second equaliser.

The microphone system may further comprise a time delay block, configured to apply a time delay to at least one of the first filtered signal and the second equaliser function. The time delay block may comprise an all-pass filter.

According to an aspect of the present invention, there is provided an earbud, comprising a microphone system according to the first aspect.

According to an aspect of the present invention, there is provided an audio listening system, comprising a pair of said earbuds.

In some embodiments, this has the advantage that the first transducer, typically a microphone, can be optimised for use in conditions when wind noise may be an issue, by raising its acoustic cut-off frequency, without compromising the ability of the microphone to generate a signal with a wide bandwidth.

In some embodiments, this has the advantage that it provides the ability to accurately detect low frequency signals, for example for medical or seismic applications. Such applications often require detection of low frequency acoustic signals, for example in a phonocardiogram or breathing-related sounds.

BRIEF DESCRIPTION OF DRAWINGS

For a better understanding of the invention, and to show how it may be put into effect, reference will now be made, by way of example, to the accompanying drawings, in which:—

DETAILED DESCRIPTION

The description below sets forth example embodiments according to this disclosure. Further example embodiments and implementations will be apparent to those having ordinary skill in the art. Further, those having ordinary skill in the art will recognize that various equivalent techniques may be applied in lieu of, or in conjunction with, the embodiments discussed below, and all such equivalents should be deemed as being encompassed by the present disclosure.

Figure 1:
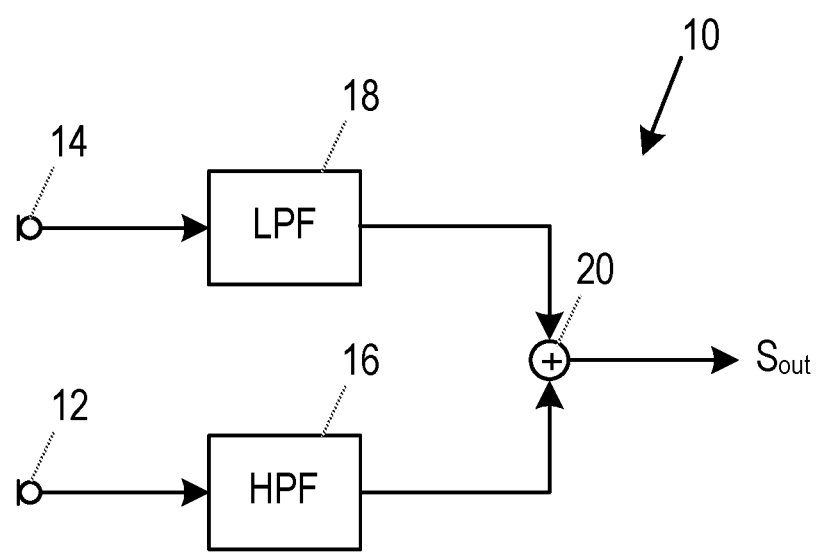
FIG. 1 illustrates a microphone system in accordance with one aspect of the disclosure.

FIG. 1 shows a microphone system 10, for use in generating electronic signals that represent ambient sounds.

The microphone system 10 comprises a first transducer 12, for generating a first acoustic signal, and a second transducer 14, for generating a second acoustic signal.

In general, the first transducer 12 and the second transducer 14 have different properties. More specifically, in some embodiments, the first transducer 12 and the second transducer 14 have different frequency responses, that is, the first transducer 12 has a better frequency response during one part of a frequency range of interest, while the second transducer 14 has a better frequency response during another part of the frequency range of interest.

For example, the first transducer 12 and the second transducer 14 may be two microphones, which have different porting arrangements, or different membrane designs, or some other difference(s), which mean that the first transducer 12 has a better frequency response during an upper part of a frequency range of interest, while the second transducer 14 has a better frequency response during a lower part of the frequency range of interest.

In some embodiments, the first and second transducers are different varieties, which mean that they have different frequency-dependent properties.

In some embodiments, the first and second transducers have different signal-to-noise ratio (SNR) properties, for example because of the way in which they are deployed on a device. For example, in the case of two transducers (such as microphones) on an in-ear type earphone, or earbud, an externally facing microphone will be subject to greater (low frequency) wind noise than an internally facing microphone. Thus, signals detected by the externally facing microphone will have a lower SNR than the signals detected by the internally facing microphone.

The signal generated by the first transducer 12 is passed to a high-pass filter 16, for generating a first filtered signal. The signal generated by the second transducer 14 is passed to a low-pass filter 18, for generating a second filtered signal. The first filtered signal and the second filtered signal are passed to an adder 20, for forming an output signal $S_{out}$ of the microphone system as a sum of the first filtered signal and the second filtered signal.

The cut-off frequency of the high-pass filter 16, and the cut-off frequency of the low-pass filter 18, are set to be at least approximately equal. This has the effect that high frequency components of ambient sounds will be detected by the first transducer 12 with a high sensitivity, and the resulting signals will appear in the output signal of the microphone system 10, while any high frequency components of signals generated by the second transducer 14 will be removed by the low-pass filter 18. Similarly, low frequency components of ambient sounds will be detected by the second transducer 14 with a high sensitivity, and the resulting signals will appear in the output signal of the microphone system 10, while any low frequency components of signals generated by the first transducer 12 will be removed by the high-pass filter 16.

Thus, the microphone system 10 has a wider bandwidth than either of the transducers considered separately.

Figure 2:
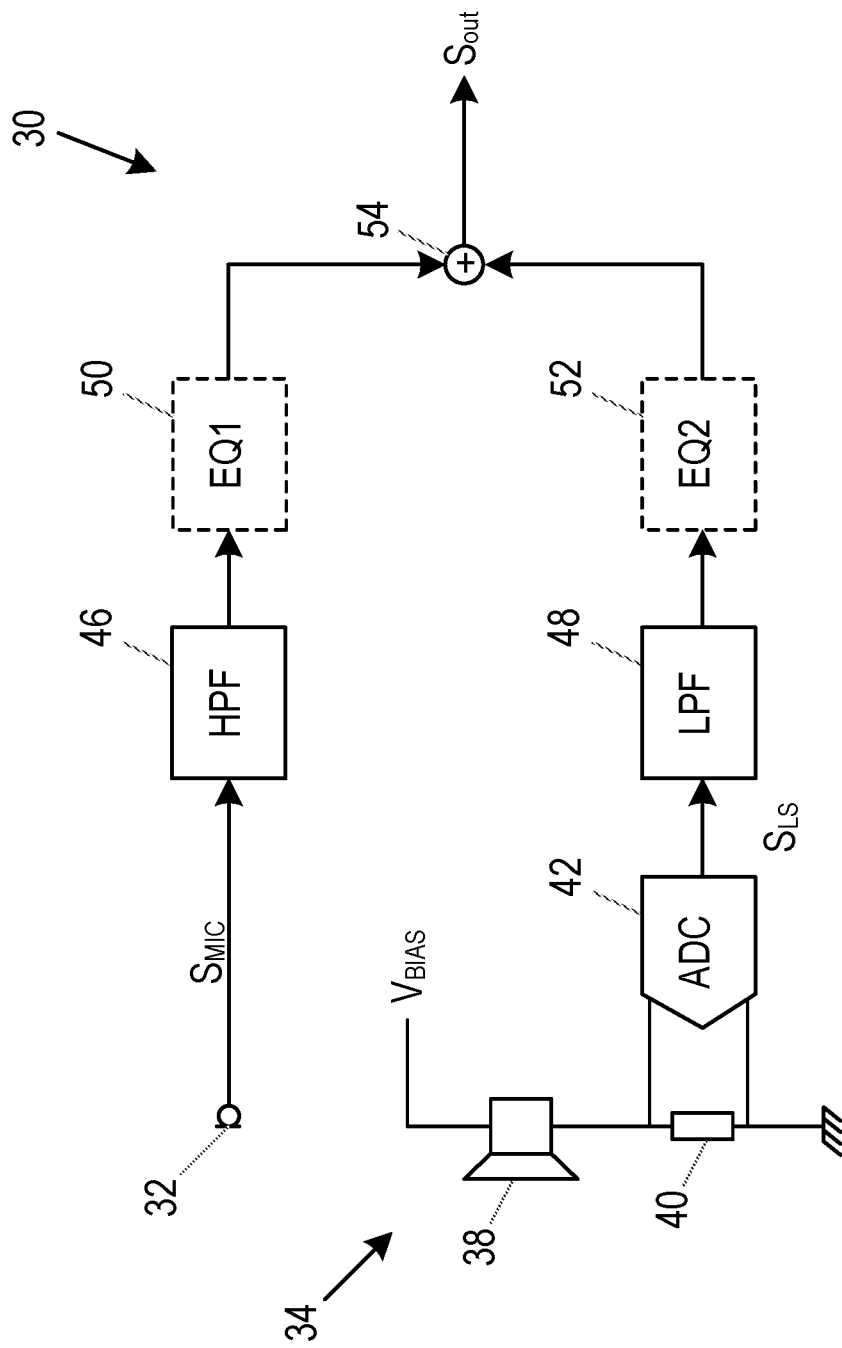
FIG. 2 illustrates a microphone system in accordance with another aspect of the disclosure.

FIG. 2 shows a further microphone system 30, of the general type shown in FIG. 1, for use in generating electronic signals that represent ambient sounds. The system 30 is particularly suited to use in an earphone device, for example an earbud that includes a loudspeaker positioned such that it directs sounds into the ear canal of a person wearing the earbud, and that also includes a microphone facing in the same direction as the loudspeaker for detecting sounds in the ear canal of the wearer.

The microphone system 30 comprises a first transducer 32, for generating a first acoustic signal, and a second transducer 34, for generating a second acoustic signal. Specifically, in this embodiment, the first transducer 32 comprises a microphone, which produces a signal $S_{MIC}$ with good sensitivity at frequencies above about 1 kHz. It is assumed here that in this illustrated embodiment the signal $S_{MIC}$ generated by the first transducer 32 is a digital signal, for example because the first transducer 32 includes an analog-digital converter. More generally, the first transducer may produce an analog signal, or it may produce a digital signal, or it may be configurable such that it produces either an analog or a digital signal. When the first transducer produces a digital signal, the sample rate thereof may be fixed or may be configurable.

The second transducer 34 comprises a loudspeaker 38, to which a bias voltage $V_{BIAS}$ is applied. The current passing through the voice coil of the loudspeaker 38 also passes through a resistor 40, which has an analog-digital converter 42 connected in parallel therewith. The output $S_{LS}$ of the analog-digital converter 42 can be regarded as the output signal of the second transducer 34, and thus the second transducer 34 has good sensitivity for signals below about 1 kHz.

Therefore, the first transducer 32 has a better frequency response in an upper part of an audio frequency range, while the second transducer 34 has a better frequency response in a lower part of the audio frequency range.

The signal $S_{MIC}$ generated by the first transducer 32 is passed to a high-pass filter 46, for generating a first filtered signal. The signal $S_{LS}$ generated by the second transducer 34 is passed to a low-pass filter 48, for generating a second filtered signal.

The first filtered signal may be passed to a first equalizer block (EQ1) 50, while the second filtered signal may be passed to a second equalizer block (EQ2) 52. After any equalization, if the first equalizer block 50 and the second equalizer block 52 are present, the first filtered signal and the second filtered signal are passed to an adder 54, where they are summed together for forming an output signal $S_{out}$ of the microphone system.

As described in more detail below, the equalizer blocks 50, 52 may be provided to compensate for any gain difference between the first transducer 32 and the second transducer 34, and, if required, to flatten the combined frequency response of the transducers. There may also be all-pass filters in one of the equalizer blocks 50, 52 to time align the signals if needed. For example, if the analog-digital converter 42 introduces a delay in the signal path from the second transducer 34, an all-pass filter may be included in the equalizer block 50 to introduce a corresponding delay in the signal path from the first transducer 32, so that the signals from the two transducers remain in time alignment. Similarly, if an analog-digital converter associated with the first transducer 32 introduces a longer delay than the analog-digital converter 42, an all-pass filter may be included in the equalizer block 52 to introduce a corresponding extra delay in the signal path from the second transducer 34, so that the signals from the two transducers remain in time alignment.

The cut-off frequency of the high-pass filter 46, and the cut-off frequency of the low-pass filter 48, are set to be at least approximately equal. This has the effect that high frequency components of sounds in the region of the first transducer 32 and the loudspeaker 38 will be detected by the first transducer 32 with a high sensitivity, and the resulting signals will appear in the output signal of the microphone system 30, while any high frequency components of signals generated by the second transducer 34 will be removed by the low-pass filter 48. Similarly, low frequency components of sounds in the region of the first transducer 32 and the loudspeaker 38 will be detected by the second transducer 34 with a high sensitivity, and the resulting signals will appear in the output signal of the microphone system 30, while any low frequency components of signals generated by the first transducer 32 will be removed by the high-pass filter 46.

Thus, the output signal $S_{out}$ is derived from a mixture of the signals derived from the first transducer 32 and the loudspeaker 38.

Figure 3:
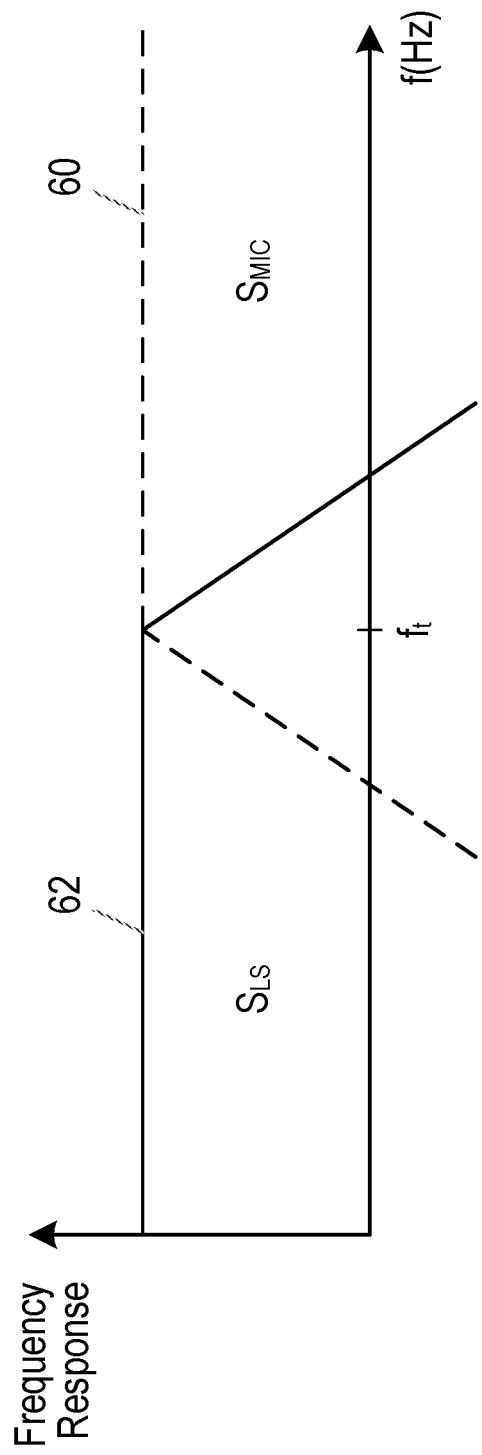
FIG. 3 illustrates an aspect of the microphone system of FIG. 2.

FIG. 3 is a schematic representation of the frequency responses of the filters 46, 48. Specifically, in this example, the frequency response 60 of the high-pass filter 46 is shown by a dashed line, while the frequency response 62 of the low-pass filter 48 is shown by a solid line.

In this example, the frequency response 60 of the high-pass filter 46 has a cut-off frequency $f_t$, and rolls off for frequencies below the cut-off frequency. The frequency response 62 of the low-pass filter 48 has the same cut-off frequency $f_t$, and rolls off for frequencies above the cut-off frequency.

In other embodiments, the cut-off frequencies of the high-pass filter 46 and the low-pass filter 48 may be approximately equal, but may not be the same. In general, the frequency responses of the two filters need to be at least approximately complementary, i.e. with both having −3 dB gain at the same frequency.

The cut-off frequencies of the high-pass filter 46 and the low-pass filter 48 may be set based on the properties of the respective transducers, in order to maximise the sensitivity of the microphone system across the frequency range that is of interest in any particular application.

The high-pass filter 46 and the low-pass filter 48 may also have frequency responses that compensate for any known frequency characteristics of the transducers, such as the temperature dependence of the Helmholtz responses of the transducers.

Figure 4:
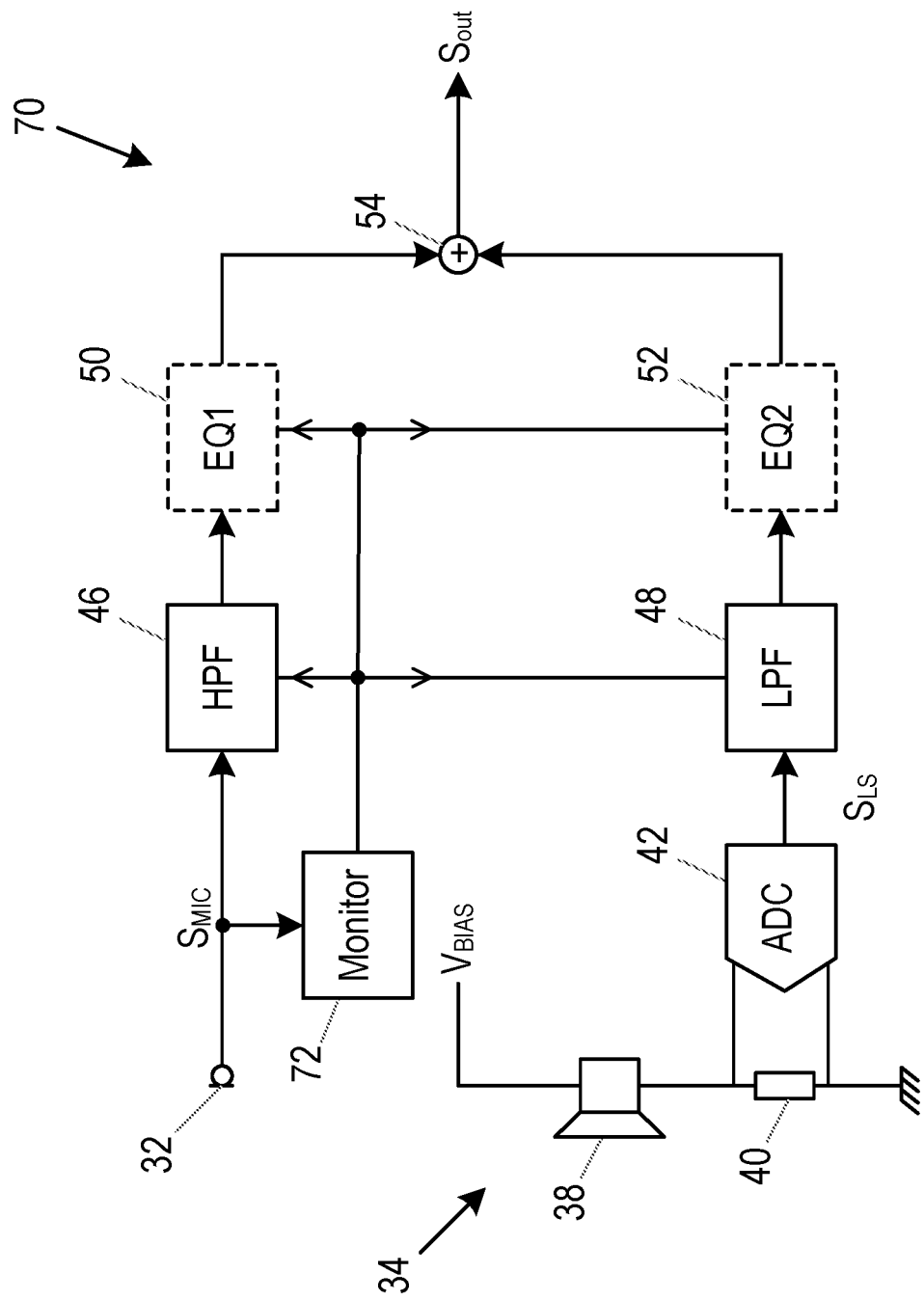
FIG. 4 illustrates a microphone system in accordance with another aspect of the disclosure.

FIG. 4 shows an embodiment of a microphone system 70 in which the cut-off frequencies of the high-pass filter 46 and the low-pass filter 48 may be dynamically adjusted.

Thus, in FIG. 4, the microphone system 70 is largely the same as the microphone system 30 of FIG. 2, and common features are indicated by the same reference numerals.

In addition, the microphone system 70 includes a monitor block 72, which may detect the magnitude of the microphone output signal $S_{MIC}$. The monitor block 72 may then take steps to adapt the cut-off frequency of the high-pass filter 46 and/or the cut-off frequency of the low-pass filter 48 as a function of $S_{MIC}$. Specifically, as one example, the cut-off frequency of the high-pass filter 46 and/or the cut-off frequency of the low-pass filter 48 may be adapted to deal with overload conditions. As one example of this, in the presence of wind noise, the microphone output signal $S_{MIC}$ may start distorting at low frequencies. In this situation, the monitor block 72 may detect clipping of the signal $S_{MIC}$, or it may include a prediction function allowing it to determine from the detected magnitude of the microphone output signal $S_{MIC}$ that clipping may be about to start. In response, the cut-off frequencies of the high-pass filter 46 and of the low-pass filter 48 may be increased so that the output signal $S_{out}$ contains less of the signal $S_{MIC}$ from the first transducer 32, and more of the signal $S_{LS}$ from the loudspeaker 38.

As another example, the monitor block 72 may detect a signal-to-noise ratio of the microphone output signal $S_{MIC}$, and the cut-off frequency of the high-pass filter 46 and/or the cut-off frequency of the low-pass filter 48 may be adapted in response to the presence of low frequency noise in the microphone output signal $S_{MIC}$. The first transducer 32 may be subject to significant wind noise, which adversely affects the microphone output signal $S_{MIC}$, in particular at low frequencies, and reduces the signal-to-noise ratio (SNR) of the signal. Thus, when there is a high level of wind noise, and a poor SNR at low frequencies, the cut-off frequencies of the high-pass filter 46 and the low-pass filter 48 may be increased, so that the output signal $S_{out}$ contains less of the signal $S_{MIC}$ from the first transducer 32, and more of the signal $S_{LS}$ from the loudspeaker 38, which will improve the SNR.

When the microphone system 70 includes the optional equalizer blocks 50, 52, the monitor block 72 may take steps to adapt the operation of the equalizer block 50, and/or the operation of the equalizer block 52 as a function of $S_{MIC}$. Specifically, as one example, when the monitor block 72 is configured to detect the magnitude of the microphone output signal $S_{MIC}$, the monitor block 72 may then take steps to adapt the gain applied by the equalizer block 50, and/or by the equalizer block 52 as a function of $S_{MIN}$. For example, when it determines that the microphone output signal $S_{MIC}$ has been clipped, it may increase the gain of the equalizer block 50 to compensate.

As another example, when the monitor block 72 is configured to detect a signal-to-noise ratio of the microphone output signal $S_{MIC}$, the operation of the equalizer block 50, and/or the operation of the equalizer block 52 may be adapted in response to the presence of noise in the microphone output signal $S_{MIC}$.

Figure 5:
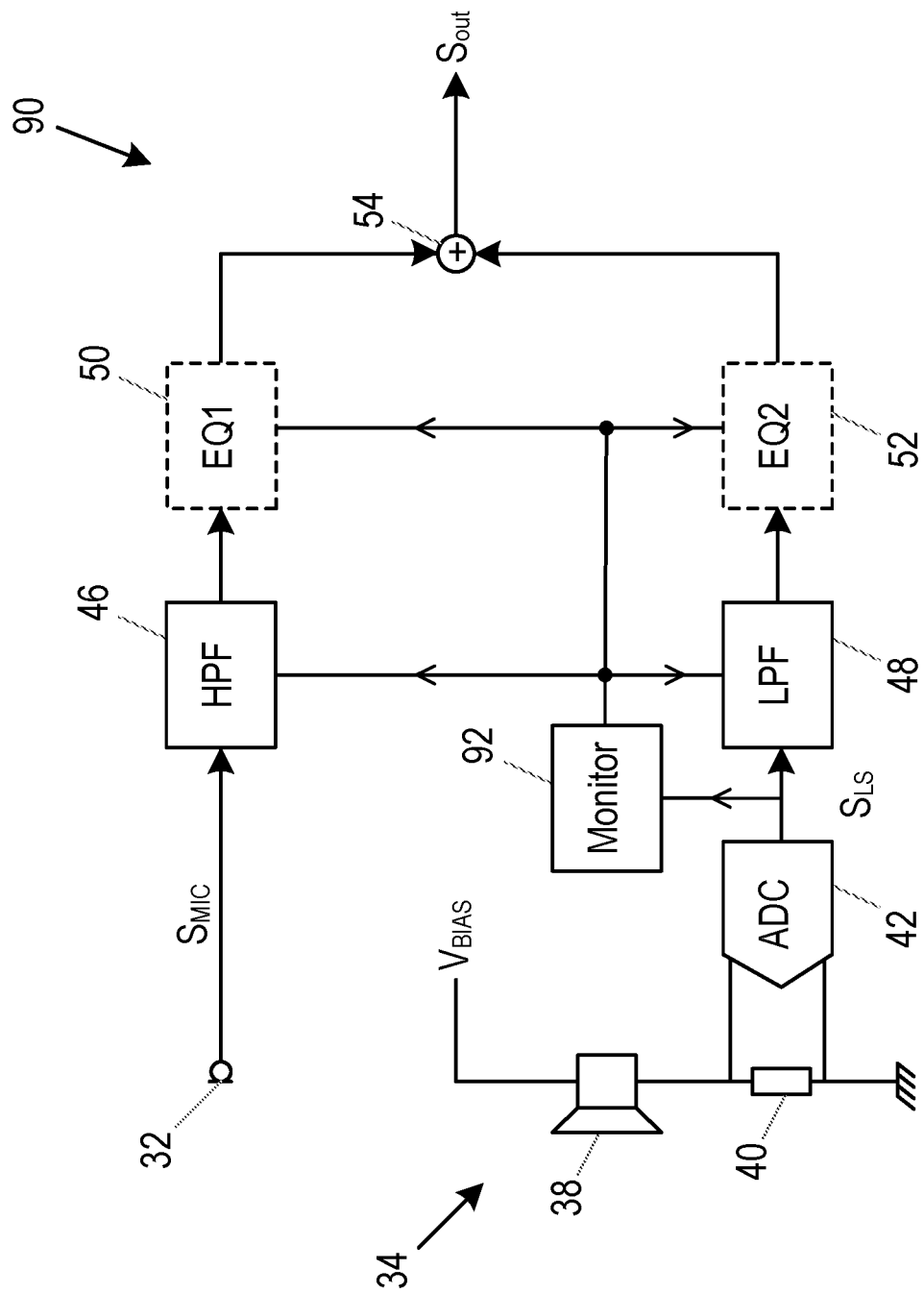
FIG. 5 illustrates a microphone system in accordance with another aspect of the disclosure.

FIG. 5 shows an alternative embodiment of a microphone system 90 in which the cut-off frequencies of the high-pass filter 46 and the low-pass filter 48 may be dynamically adjusted.

Thus, in FIG. 5, the microphone system 90 is largely the same as the microphone system 30 of FIG. 2, and common features are indicated by the same reference numerals.

In addition, the microphone system 90 includes a monitor block 92, which may detect the magnitude of the loudspeaker transducer output signal $S_{LS}$. The monitor block 92 may then take steps to adapt the cut-off frequency of the high-pass filter 46 and/or the cut-off frequency of the low-pass filter 48 as a function of $S_{LS}$. Thus, for example, if the magnitude of the loudspeaker transducer output signal $S_{LS}$ is found to be relatively large, for example in situations with high ambient noise, the cut-off frequencies of the high-pass filter 46 and the low-pass filter 48 may be increased, so that the output signal $S_{out}$ contains less of the signal $S_{MIC}$ from the first transducer 32, and more of the signal $S_{LS}$ from the loudspeaker 38.

When the microphone system 90 includes the optional equalizer blocks 50, 52, the monitor block 92 may take steps to adapt the operation of the equalizer block 50, and/or the operation of the equalizer block 52 as a function of $S_{LS}$.

For example, when the monitor block 92 is configured to detect the magnitude of the signal $S_{LS}$, the monitor block 92 may then take steps to adapt the gain applied by the equalizer block 50, and/or by the equalizer block 52 as a function of $S_{LS}$. As another example, when the monitor block 92 is configured to detect a signal-to-noise ratio of the signal $S_{LS}$, the operation of the equalizer block 50, and/or the operation of the equalizer block 52 may be adapted in response to the presence of noise in the signal $S_{LS}$.

Figure 6:
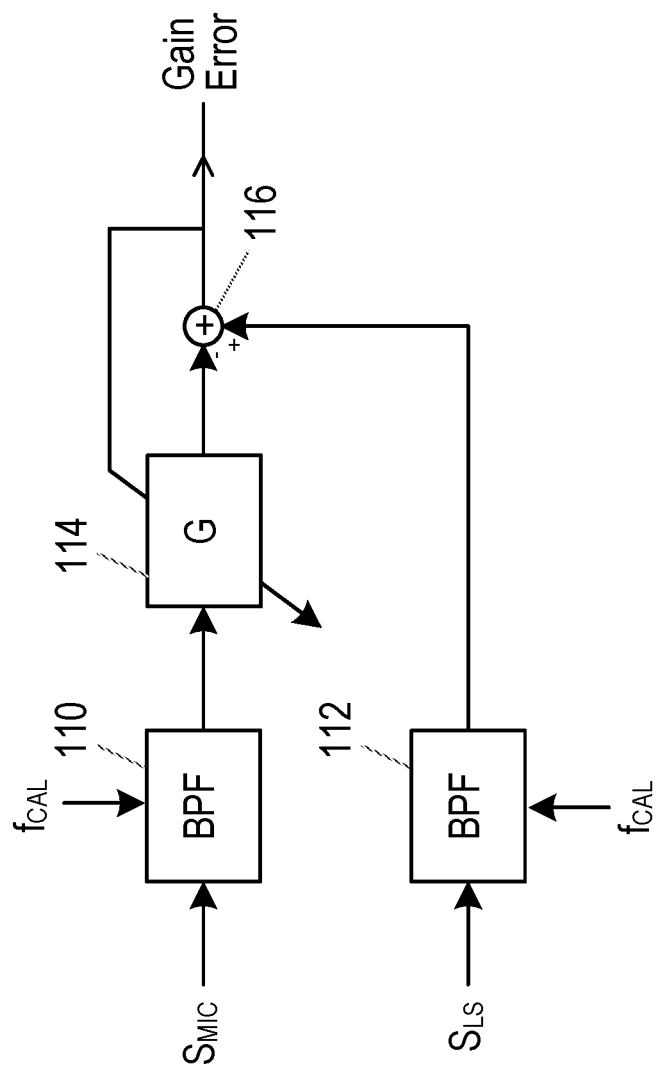
FIG. 6 illustrates an aspect of the operation of a microphone system in accordance with aspects of the disclosure.

FIG. 6 illustrates a calibration mode of operation of a microphone system as described herein, which may be one of the microphone system 30 shown in FIG. 2, the microphone system 70 shown in FIG. 4, or the microphone system 90 shown in FIG. 5, as examples. The calibration mode may be entered when the device is manufactured, to account for device-to-device variability, and/or it may be entered during operation, in order to take account of factors such as temperature variation and ageing.

The signal $S_{MIC}$ generated by the first transducer 32 is passed to a first band-pass filter 110, and the signal $S_{LS}$ generated by the second transducer 34 is passed to a second band-pass filter 112. The characteristics of the two band-pass filters 110, 112, are matched, and they both have a relatively narrow pass band at a frequency $f_{CAL}$ where both of the transducers have some gain.

The output of one of the band-pass filters, in the illustrated example the band-pass filter 110, is passed to an adaptive gain block 114, and the output thereof is subtracted from the output of the other of the band-pass filters, in the illustrated example the band-pass filter 112, in a subtractor 116.

The output of the subtractor 116 is a gain error, and an adaptive loop is used to adjust the gain G of the adaptive gain block 114 until the gain error becomes equal to zero. This identifies a gain value G that accounts for any mismatch in sensitivity between the two transducers, and so that can be applied to the signals in one of the equaliser blocks 50, 52.

There is thus described a microphone system that allows detection of acoustic signals across a wide frequency range.

Embodiments may be implemented as an integrated circuit which in some examples could be a codec or similar. Embodiments may be implemented in a host device, especially a portable and/or battery powered host device such as a mobile computing device for example a laptop, notebook or tablet computer, a games console, a remote control device, a home automation controller or a domestic appliance including a domestic temperature or lighting control system, a toy, a machine such as a robot, an audio player, a video player, or a mobile telephone for example a smartphone. The device could be a wearable device such as a smartwatch. It will be understood that embodiments may be implemented as part of a system provided in a home appliance or in a vehicle or interactive display. The amplifier circuit may be an audio amplifier used to drive an audio transducer such as a loudspeaker or surface audio system, but it will be understood that the amplifier may be used to drive other transducers, e.g. a vibrational transducer such as a linear resonant actuator for the generation of haptic effects. There is further provided a host device incorporating the above-described system.

The skilled person will recognise that some aspects of the above-described apparatus and methods, for example the discovery and configuration methods may be embodied as processor control code, for example on a non-volatile carrier medium such as a disk, CD- or DVD-ROM, programmed memory such as read only memory (Firmware), or on a data carrier such as an optical or electrical signal carrier. For many applications, embodiments will be implemented on a DSP (Digital Signal Processor), ASIC (Application Specific Integrated Circuit) or FPGA (Field Programmable Gate Array). Thus the code may comprise conventional program code or microcode or, for example code for setting up or controlling an ASIC or FPGA. The code may also comprise code for dynamically configuring re-configurable apparatus such as re-programmable logic gate arrays. Similarly the code may comprise code for a hardware description language such as Verilog™ or VHDL (Very high speed integrated circuit Hardware Description Language). As the skilled person will appreciate, the code may be distributed between a plurality of coupled components in communication with one another. Where appropriate, the embodiments may also be implemented using code running on a field-(re) programmable analogue array or similar device in order to configure analogue hardware.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference numerals or labels in the claims shall not be construed so as to limit their scope.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

The invention claimed is:

1. A microphone system, comprising:
 a first transducer, for generating a first acoustic signal;
 a second transducer, for generating a second acoustic signal;
 a high-pass filter, for receiving the first signal and generating a first filtered signal, wherein the first transducer and the second transducer have different acoustic properties;
 a low-pass filter, for receiving the second signal and generating a second filtered signal;
 an adder, for forming an output signal of the microphone system as a sum of the first filtered signal and the second filtered signal;
 a first equaliser, configured to apply a first equaliser function to the first filtered signal before it is passed to the adder; and
 a second equaliser, configured to apply a second equaliser function to the second filtered signal before it is passed to the adder.

2. A microphone system according to claim 1, wherein the first transducer and the second transducer have different noise levels as a function of frequency.

3. A microphone system according to claim 1, wherein the first transducer and the second transducer have different frequency responses.

4. A microphone system according to claim 1, wherein the first and second transducers are different types of sensor.

5. A microphone system according to claim 4, wherein the second transducer is a loudspeaker.

6. A microphone system according to claim 1, wherein a cut-off frequency of the high-pass filter is approximately equal to a cut-off frequency of the low-pass filter.

7. A microphone system according to claim 1, wherein cut-off frequencies of the high-pass filter and of the low-pass filter are dynamically adjustable.

8. A microphone system according to claim 7, wherein the cut-off frequencies of the high-pass filter and of the low-pass filter are dynamically adjustable in response to a detected magnitude of the first signal.

9. A microphone system according to claim 8, comprising a control block for increasing the cut-off frequency of the high-pass filter and of the low-pass filter in response to determining that the detected magnitude of the first signal is greater than a first threshold value.

10. A microphone system according to claim 7, wherein the cut-off frequencies of the high-pass filter and of the low-pass filter are dynamically adjustable in response to a detected magnitude of the second signal.

11. A microphone system according to claim 10, comprising a control block for decreasing the cut-off frequency of the high-pass filter and of the low-pass filter in response to determining that the detected magnitude of the second signal is greater than a second threshold value.

12. A microphone system according to claim 1, wherein the first transducer is configured to operate either in a first mode, in which it generates the first signal as a digital signal, or in a second mode, in which it generates the first signal as an analog signal.

13. A microphone system according to claim 1, wherein the first transducer is configured to operate either in a first mode, in which it generates the first signal as a digital signal with a first sampling rate, or in a second mode, in which it generates the first signal as a digital signal with a second sampling rate.

14. A microphone system according to claim 1, further comprising:
 a first band-pass filter, configured to receive the first signal during a calibration mode;

a second band-pass filter, configured to receive the second signal during the calibration mode;
an adjustable gain block; and
a feedback loop,
wherein the first band-pass filter and the second band-pass filter each have pass bands that encompass a first frequency at which the high-pass filter and the low-pass filter both pass signals,
wherein the feedback loop acts during the calibration mode to determine a gain value required such that the first signal and the second signal have the same magnitude at the first frequency, and
wherein, in operation of the microphone system, said required gain value is applied to the first filtered signal and/or to the second filtered signal before it is passed to the adder.

15. A microphone system according to claim 14, wherein said required gain value is applied to the first filtered signal in the first equaliser and/or to the second filtered signal in the second equaliser.

16. A microphone system according to claim 1, further comprising a time delay block, configured to apply a time delay to at least one of the first filtered signal and the second filtered signal.

17. A microphone system according to claim 16, wherein the time delay block comprises an all-pass filter.

18. An earbud, comprising a microphone system according to claim 1.

19. An audio listening system, comprising a pair of earbuds in accordance with claim 18.

* * * * *